United States Patent [19]

Asai et al.

[11] Patent Number: 4,832,621
[45] Date of Patent: May 23, 1989

[54] PROBE FOR IN-CIRCUIT EMULATOR

[75] Inventors: Hironobu Asai; Takeshi Oikawa, both of Tokyo, Japan

[73] Assignee: Ando Electric Co., Ltd., Tokyo, Japan

[21] Appl. No.: 9,157

[22] Filed: Jan. 30, 1987

[30] Foreign Application Priority Data

Jan. 31, 1986 [JP] Japan ................... 61-13069[U]

[51] Int. Cl.⁴ ............................................ H01R 11/00
[52] U.S. Cl. ...................... 439/492; 174/117 FF; 268; 439/493
[58] Field of Search ......... 174/117 F, 117 FF, 117 R, 174/117 PC; 439/492, 493

[56] References Cited

U.S. PATENT DOCUMENTS

| 2,997,521 | 8/1961 | Dahlgren | 439/492 X |
| 3,188,601 | 6/1965 | DeTar | 439/492 X |
| 3,387,248 | 6/1968 | Rees | 174/117 R |
| 4,219,928 | 9/1980 | Kuo | 174/117 FF X |
| 4,748,293 | 5/1988 | Kikuchi et al. | 174/117 PC |

FOREIGN PATENT DOCUMENTS

| 2274123 | 6/1976 | France | 174/117 F |
| 111684 | 9/1975 | Japan | 174/117 F |

Primary Examiner—Morris H. Nimmo
Attorney, Agent, or Firm—Flynn, Thiel, Boutell & Tanis

[57] ABSTRACT

A probe for an in-circuit emulator comprising a flexible substrate composed of a base film, a pattern provided on a central portion of the base film, plastic parts mounted on both ends of the base film, a connecting element detachably provided at one end of the flexible substrate, and reinforcing members mounted on the plastic parts.

6 Claims, 2 Drawing Sheets

PROBE FOR IN-CIRCUIT EMULATOR

BACKGROUND OF THE INVENTION

1. Field of the Invention

The present invention relates to a probe for an in-circuit emulator, more particularly to a mechanism to reinforce a flexible substrate when the flexible substrate is used as the probe for the in-circuit emulator.

2. Description of Prior Art

An in-circuit emulator is an emulating device for substituting a part of the circuit to be mounted on an actual device for another circuit system. There is a case to use a flexible substrate as a probe for the in-circuit emulator to match an LSI package of a leadless chip carrier or a pingrid array.

A conventional probe for the in-circuit emulator using a flexible substrate is described with reference to FIGS. 5 and 6.

FIG. 5 is a schematic view of a conventional probe, in which designated 1 is a flexible substrate, 2 is a neck portion thereof, 3 is a connecting element, 4 is a connector, 6 is a base film of the substrate 1, and 5 is a pattern formed on the base film 6. The connecting element 3 is a part where an LSI package mounted on the actual device is detached therefrom and attached thereto and the detachment and attachment is repeatedly effected. The connector 4 is a part for connecting the flexible substrate 1 with the in-circuit emulator, the neck portion 2 is narrowed for connecting the connecting element 3 with the flexible substrate 1. The flexible substrate 1 is usually used for connecting parts mounted on the device with each other, and composed of a base 6 made of a plastic film which is liable to be broken or cracked when it is sharply bent or tensed. When the flexible substrate 1 in the cracked state is repeatedly used as the probe, the crack caused by a fatigue grows to reach the pattern to break finally the flexible substrate 1. To prevent the breakage of the pattern 5 caused by such cracking of the flexible substrate 1, the flexible substrate 1 is structured as shown in FIG. 3.

FIG. 6 is a cross sectional view of a neck portion of the conventional FIG. 5 probe, in which designated at 6 is a base film, 7, 8 are respectively plastic portions of the base film 6, and 13 is a covering film. The base film 6 and covering film 13 is well known in the prior art and may, for example, be of a material such as polyimide, polyamide, or polyester imide. The pattern 5 is disposed centrally of the flexible substrate 1 and away from both edges comprised of the plastic parts 7 and 8. According to the structure in FIG. 6, only plastic parts 7 and 8 remain in the neck portion 2 so that the plastic parts 7 and 8 are liable to be cracked. Once a crack is generated, it is liable to grow. Particularly, when the flexible substrate 1 is used as a probe, the neck portion 2 is liable to be deformed and broken.

SUMMARY OF THE INVENTION

It is an object of the present invention to provide a probe for an in-circuit emulator in which a flexible substrate is used as the probe, composed of a flexible substrate 1 having a base film 6, plastic parts 7 and 8 defining both edges of the base film 6, and reinforcing members 11 and 12 mounted on the plastic members of the substrate 1 7 and 8. The probe having such reinforcing members (11 and 12) is strong against the bending and tensile stresses applied to the probe when the probe is repeatedly used, and a crack caused by such bending and tensile is prevented from growing.

The above and other objects, features and advantages of the present invention will become more apparent from the following description when taken in conjunction with the accompanying drawings.

PREFERRED EMBODIMENT OF THE INVENTION

Figure 1:
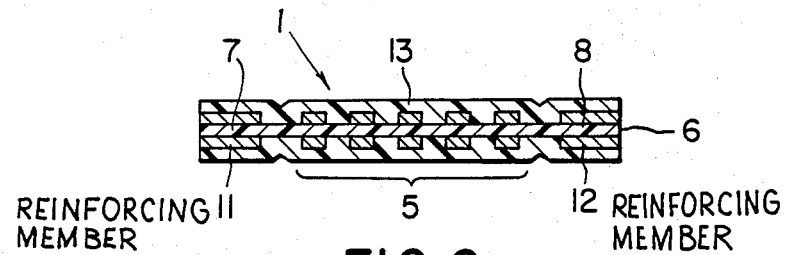
FIG. 1 is a cross-sectional view similar to FIG. 5 but illustrating an embodiment of the present invention.
Figure 2:
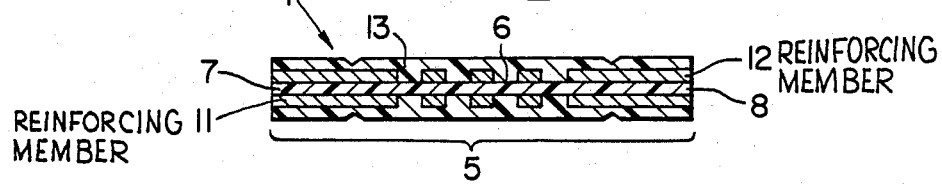
FIGS. 2 to 4 are cross-sectional views similar to FIG. 1 but illustrating other embodiments of the present invention.
Figure 5:
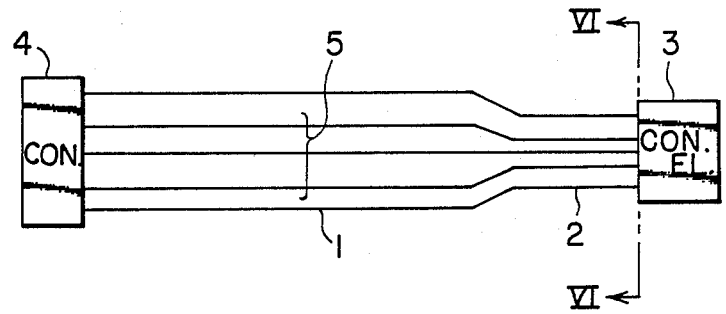
FIG. 5 is a schematic plan view of a conventional probe.
Figure 6:
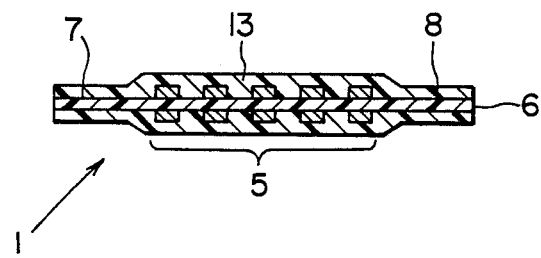
FIG. 6 is a cross sectional view substantially as taken on the line VI—VI of FIG. 5.

The present invention will be described with reference to FIGS. 1 to 4. The numerals used in FIGS. 5 and 6 are applied to FIGS. 1 to 4. Designated at 11 and 12 are respectively reinforcing members. FIGS. 1 to 4 are respectively cross sectional views of flexible substrate 1 embodying the invention, corresponding to the neck portion in prior art FIG. 5. In FIGS. 1-4 the reinforcing members 11 and 12 sandwich the plastic parts 7, 8 to the inward direction thereof. The reinforcing members 11 and 12 may be formed from portions of the copper foil left over from the pattern 5. The reinforcing members 11 and 12 may be formed as the outermost part of the pattern 5, and such outermost pattern part is enlarged as shown in FIG. 2.

Figure 3:
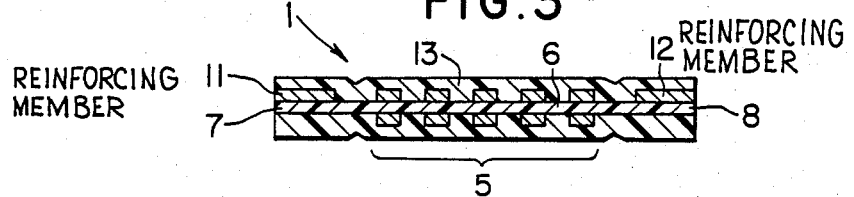
Figure 4:
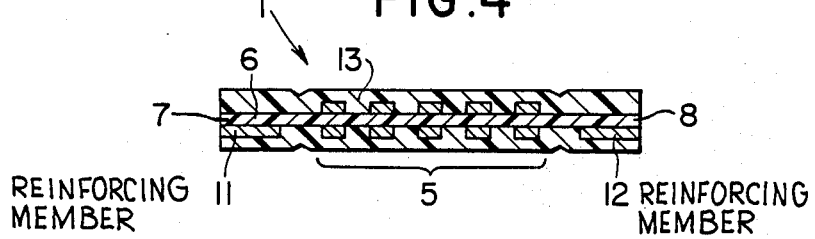

Although the reinforcing members 11 and 12 are mounted on both sides of the plastic parts 7 and 8 in FIG. 2, the reinforcing members (11 and 12) may be mounted on one side of the plastic parts 7 and 8 as shown in FIGS. 3 and 4.

With such an arrangement, when the flexible substrate is used as the probe for the in-circuit emulator, static tensile strength is increased since the reinforcing members 11, 12 are mounted on the plastic parts 7, 8 of the flexible substrate 1. As a result, when the base film 6 is repeatedly bent or tensed, a crack is produced in the base film but the crack is hardly liable to grow so that the life of the probe is extended.

While we have described certain present preferred embodiments of the invention, it is to be distinctly understood that the invention is not limited thereto but may be otherwise variously embodied within the scope of the following claims.

What is claimed is:

1. A probe for an in-circuit emulator comprising:
   (a) a flexible substrate comprising an elongate base film, said base film having a longitudinally extended central portion flanked laterally by longitudinally extended edge portions, said flexible substrate further comprising a pattern provided on and extending along said central portion of said base film, said pattern being confined to said central portion of said base film so as not to overlap onto said edge portions of said base film, said edge portions extending laterally beyond said pattern;
   (b) a connecting element detachably provided at one end of said flexible substrate; and
   (c) reinforcing means mounted on said edge portions of said base film for reinforcing the latter against fatigue cracking during repetitive flexing of said flexible substrate and thereby guarding against breaking of said pattern caused by such cracking extending widthwise through said edge portions to said center portion of said base film and to said pattern carried by said central portion, said reinforcing means comprising reinforcing members respectively mounted on said edge portions of said base film, said reinforcing members being spaced laterally outboard from said pattern so as not to overlap same, the laterally outer edges of said reinforcing members being substantially flush with the laterally outer edges of said edge portions on which they are mounted, said reinforcing members being of substantially the same thickness as said pattern.

2. A probe for an in-circuit emulator according to claim 1, wherein said reinforcing members are mounted on both sides of said edge portions of said base film.

3. A probe for an in-circuit emulator according to claim 1, wherein said reinforcing members are mounted on one side of said edge portions of said base film.

4. A probe for an in-circuit emulator according to claim 1, wherein said reinforcing members are formed of material remaining from formation of said pattern.

5. The apparatus of claim 4, in which said reinforcing members are substantially coplanar with said pattern.

6. The apparatus of claim 1, in which said reinforcing members and pattern are of copper foil, said reinforcing members being remainders left after formation of the pattern.

* * * * *